(12) United States Patent
Zheng

(10) Patent No.: US 9,219,083 B1
(45) Date of Patent: Dec. 22, 2015

(54) ARRAY SUBSTRATE AND LIQUID CRYSTAL DISPLAY PANEL

(71) Applicant: Shenzhen China Star Optoelectronics Technology Co., Ltd., Shenzhen, Guangdong (CN)

(72) Inventor: Hua Zheng, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/396,045

(22) PCT Filed: Sep. 29, 2014

(86) PCT No.: PCT/CN2014/087790
§ 371 (c)(1),
(2) Date: Oct. 21, 2014

(51) Int. Cl.
*G02F 1/136* (2006.01)
*H01L 27/12* (2006.01)
*G02F 1/1368* (2006.01)
*G02F 1/1362* (2006.01)

(52) U.S. Cl.
CPC ............ *H01L 27/124* (2013.01); *G02F 1/1368* (2013.01); *G02F 1/136227* (2013.01); *G02F 1/136286* (2013.01); *H01L 27/1218* (2013.01)

(58) Field of Classification Search
CPC .................. G02F 1/1368; G02F 1/136227
See application file for complete search history.

(56) References Cited

U.S. PATENT DOCUMENTS

2015/0029430 A1* 1/2015 Song ................. G02F 1/133707
349/43

* cited by examiner

*Primary Examiner* — Phu Vu
(74) *Attorney, Agent, or Firm* — Andrew C. Cheng

(57) ABSTRACT

The present invention provides an array substrate and a liquid crystal display panel. In the array substrate, as to thin film transistors connected with one scan line, a width-to-length ratio of the thin film transistor(s) corresponding to the middle of the scan line is larger than the width-to-length ratio of the thin film transistors corresponding to two ends of the scan line, and thereby when data lines input voltage signals, a voltage difference between a pixel electrode(s) connected with the thin film transistor(s) corresponding to the middle of the scan line and the pixel electrodes connected with the thin film transistors corresponding to the two ends of the scan line is smaller than a threshold value. By the above described manner, the present invention can improve the uniformity of image brightness.

15 Claims, 8 Drawing Sheets

1st

2nd

6th

ARRAY SUBSTRATE AND LIQUID CRYSTAL DISPLAY PANEL

TECHNICAL FIELD

The present invention relates to the field of liquid crystal display technology, and particularly to an array substrate and a liquid crystal display panel.

DESCRIPTION OF RELATED ART

The liquid crystal display panel has advantages of excellent color performance, wide viewing angle, high contrast and so on, and thus has broad market prospects.

As shown in FIG. 1, a liquid crystal display panel 11 generally is driven to display by data drivers 12 and scan drivers 13 arranged at the periphery thereof. Scan signals on one scan line are inputted by the scan drivers 13 respectively connected with two ends of the scan line, so as to control thin film transistors (TFTs) connected with the scan line to be turned on, and then the data drivers 12 can input voltage signals needed by image display to pixel electrodes 14 of the liquid crystal display panel 11 through the turned-on thin film transistors, the display of the liquid crystal display panel 11 is achieved as a result.

However, since the RC delay of signals on the scan line, waveforms of the scan signals inputted to the scan line are distorted, i.e., when the scan signals with original normal waveforms inputted from the two ends of the scan line are transmitted toward the middle of the scan line, suffering from the RC delay influence of the scan line, the scan signals are gradually decreased, and the degree of decrease of the scan signals is more serious when the scan signals reach the middle of the scan line, so that charging ratios of the pixel electrodes 14 in the middle of the liquid crystal display panel 11 are reduced, and voltages 15 of the pixel electrodes 14 in the middle of the liquid crystal display panel 11 are lower than voltages 16 of the pixel electrodes 14 at two sides of the liquid crystal display panel 11, resulting in that a brightness in the middle of the liquid crystal display panel 11 is lower than brightnesses at the two sides of the liquid crystal display panel 11, i.e., the liquid crystal display panel 11 appears the phenomenon of "two sides being whity", the brightness uniformity of the liquid crystal display panel 11 is degraded consequently.

SUMMARY

Accordingly, a technical problem primarily is solved by the present invention is to provide an array substrate and a liquid crystal display panel, so as to improve the uniformity of image brightness.

In order to solve the above described technical problem, a technical solution proposed by the present invention is to provide an array substrate. The array substrate includes scan lines, data lines, thin film transistors and pixel electrodes. Gates of the thin film transistors are connected with the scan lines, sources of the thin film transistors are connected with the data lines, drains of the thin film transistors are connected with the pixel electrodes, and a source layer and a drain layer of each of the thin film transistors are mutually parallel. In the thin film transistors connected with one of the scan lines, width-to-length ratios of the thin film transistors are progressively decreased from the middle of the scan line to each of two ends of the scan line at intervals of a predetermined distance, the width-to-length ratios of the thin film transistors within a same predetermined distance are equal to each other, and thereby the width-to-length ratio of the thin film transistor(s) corresponding to the middle of the scan line is larger than the width-to-length ratio of the thin film transistors corresponding to the two ends of the scan line, so that when the data lines input voltage signals, a voltage difference between the pixel electrode(s) connected with the thin film transistor(s) corresponding to the middle of the scan line and the pixel electrodes connected with the thin film transistors corresponding to the two ends of the scan line is smaller than a threshold value.

In an exemplary embodiment, channel lengths of the thin film transistors are the same, channel widths of the thin film transistors are progressively decreased from the middle of the scan line to each of the two ends of the scan line at intervals of the predetermined distance, and the channel widths of the thin film transistors within a same predetermined distance are equal to each other.

In an exemplary embodiment, sizes of overlapping portions of the source layers with the drain layers of the thin film transistors are progressively decreased from the middle of the scan line to each of the two ends of the scan line at intervals of the predetermined distance, and the sizes of the overlapping portions of the source layers with the drain layers of the thin film transistors within a same predetermined distance are the same.

In order to solve the above described technical solution, another technical solution proposed by the present invention is to provide an array substrate. The array substrate includes scan lines, data lines, thin film transistors and pixel electrodes. Gates of the thin film transistors are connected with the scan lines, sources of the thin film transistors are connected with the data lines, and drains of the thin film transistors are connected with the pixel electrodes. In the thin film transistors connected with one of the scan lines, a width-to-length ratio of the thin film transistor(s) corresponding to the middle of the scan line is larger than the width-to-length ratio of the thin film transistors corresponding to two ends of the scan line, and thereby when the data lines input voltage signals, a voltage difference between the pixel electrode(s) connected with the thin film transistor(s) corresponding to the middle of the scan line and the pixel electrodes connected with the thin film transistors corresponding to the two ends of the scan line is smaller than a threshold value.

In an exemplary embodiment, in the thin film transistors connected with one of the scan lines, the width-to-length ratios of the thin film transistors are progressively decreased from the middle of the scan line to each of the two ends of the scan line at intervals of a predetermined distance, and the width-to-length ratios of the thin film transistors within a same predetermined distance are equal to each other.

In an exemplary embodiment, channel lengths of the thin film transistors are the same, channel widths of the thin film transistors are progressively decreased from the middle of the scan line to each of the two ends of the scan line at intervals of the predetermined distance, and the channel widths of the thin film transistors within a same predetermined distance are equal to each other.

In an exemplary embodiment, sizes of overlapping portions of source layers with drain layers of the thin film transistors are progressively decreased from the middle of the scan line to each of the two ends of the scan line at intervals of the predetermined distance, and the sizes of the overlapping portions of the source layers with the drain layers of the thin film transistors within a same predetermined distance are the same.

In an exemplary embodiment, in the thin film transistors connected with one of the scan lines, the width-to-length ratios of the thin film transistors are successively decreased from the middle of the scan line to each of the two ends of the scan line.

In an exemplary embodiment, a source layer and a drain layer of each of the thin film transistors are parallel to each other.

In order to solve the above described technical problem, still another technical solution proposed by the present invention is to provide a liquid crystal display panel. The liquid crystal display panel includes an array substrate, a color filter substrate and a liquid crystal layer arranged between the array substrate and the color filter substrate. The array substrate includes scan lines, data lines, thin film transistors and pixel electrodes. Gates of the thin film transistors are connected with the scan lines, sources of the thin film transistors are connected with the data lines, and drains of the thin film transistors are connected with the pixel electrodes. In the thin film transistors connected with one of the scan lines, a width-to-length ratio of the thin film transistor(s) corresponding to the middle of the scan line is larger than the width-to-length ratio of the thin film transistors corresponding to two ends of the scan line, and thereby when the data lines input voltage signals, a voltage difference between the pixel electrode(s) connected with the thin film transistor(s) corresponding to the middle of the scan line and the pixel electrodes connected with the thin film transistors corresponding to the two ends of the scan line is smaller than a threshold value.

In an exemplary embodiment, in the thin film transistors connected with one of the scan lines, the width-to-length ratios of the thin film transistors are progressively decreased from the middle of the scan line to each of the two ends of the scan line at intervals of a predetermined distance, and the width-to-length ratios of the thin film transistors within a same predetermined distance are equal to each other.

In an exemplary embodiment, channel lengths of the thin film transistors are the same, channel widths of the thin film transistors are progressively decreased from the middle of the scan line to each of the two ends of the scan line at intervals of the predetermined distance, and the channel widths of the thin film transistors within a same predetermined distance are equal to each other.

In an exemplary embodiment, sizes of overlapping portions of source layers with drain layers of the thin film transistors are progressively decreased from the middle of the scan line to each of the two ends of the scan line at intervals of the predetermined distance, and the sizes of the overlapping portions of the source layers with the drain layers of the thin film transistors within a same predetermined distance are the same.

In an exemplary embodiment, in the thin film transistors connected with one of the scan lines, the width-to-length ratios of the thin film transistors are successively decreased from the middle of the scan line to each of the two ends of the scan line.

In an exemplary embodiment, a source layer and a drain layer of each of the thin film transistors are parallel to each other.

Beneficial effects can be achieved by the present invention are that: compared with the prior art, in the array substrate of the present invention, by setting the thin film transistors corresponding to different positions of a scan line to have different width-to-length ratios, a voltage difference between the pixel electrodes corresponding to the different positions of the scan line is smaller than a threshold value, and thereby voltages of the pixel electrodes corresponding to the different positions are substantially equal to each other. As a result, brightnesses of display image corresponding to the different positions of the scan line are substantially the same, and the uniformity of image brightness is improved.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description only are some embodiments of the invention, the ordinary skill in the art can obtain other drawings according to these illustrated drawings without creative effort. In the drawings.

DETAILED DESCRIPTION OF EMBODIMENTS

In the following, with reference to accompanying drawings of embodiments of the present invention, technical solutions in the embodiments of the present invention will be clearly and completely described. Apparently, the embodiments of the present invention described below only are a part of embodiments of the present invention, but not all embodiments. Based on the described embodiments of the present invention, all other embodiments obtained by ordinary skill in the art without creative effort belong to the scope of protection of the present invention.

Figure 1:
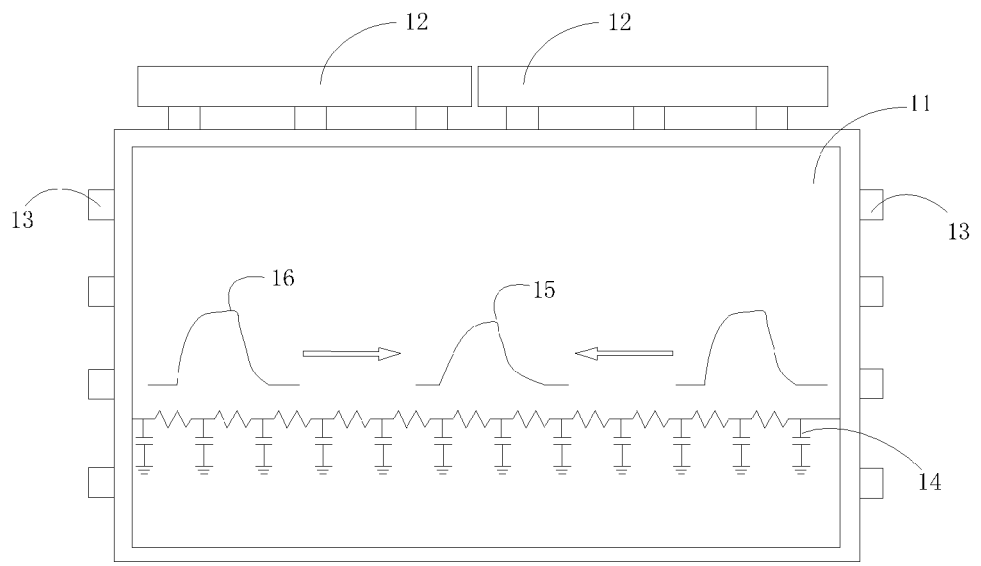
FIG. 1 is a voltage waveform diagram of pixel electrodes of a liquid crystal display panel in the prior art.
Figure 2:
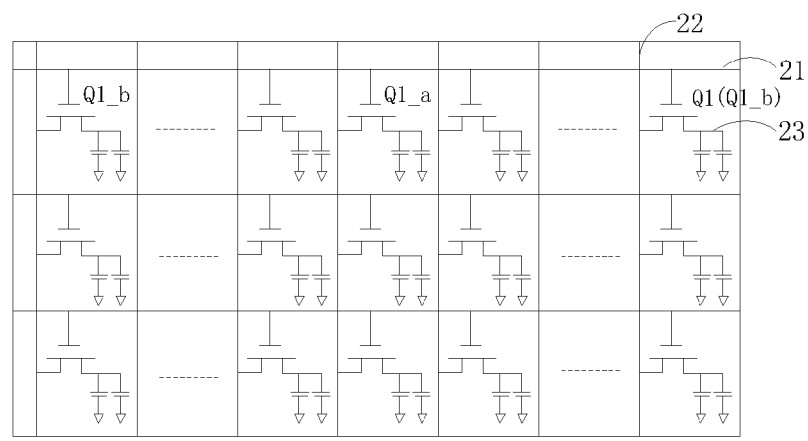
FIG. 2 is an equivalent circuit diagram of an embodiment of pixel structures of an array substrate according to the present invention.

Referring to FIG. 2, FIG. 2 is an equivalent circuit diagram of pixel structures in an embodiment of an array substrate according to the present invention. The array substrate includes scan lines 21, data lines 22, pixel electrodes 23 and thin film transistors Q1. The scan lines 21 are arranged intersecting with the data lines 22. One pixel electrode 23, one thin film transistor Q1 and mutually intersected one scan line 21 and one data line 22 together constitute one pixel structure. The array substrate includes multiple (i.e., more than one) pixel structures arranged in an array.

Gates of the thin film transistors Q1 are connected with the scan lines 21, sources of the thin film transistors Q1 are connected with the data lines 22, and drains of the thin film transistors Q1 are connected with the pixel electrodes 23. When driving the pixel electrodes 23 to achieve image display, scan drivers (not shown in FIG. 2) at two ends of each scan line 21 supply scan signals respectively from the two ends of the scan line 21 to the scan line 21 so as to control the thin film transistors Q1 to be turned on, the data lines 22 then can input voltage signals needed by image display to the pixel electrodes 23 through the turned-on thin film transistors Q1, and thereby the image display is achieved.

In all the thin film transistors Q1 connected with one of the scan lines 21, a width-to-length ratio (W/L ratio) of a thin film transistor(s) Q1_a corresponding to the middle of the scan line 21 is larger than the W/L ratio of thin film transistors Q1_b corresponding to two ends of the scan line 21. The thin film transistor(s) Q1_a corresponding to the middle of the scan line 21 is/are the thin film transistor(s) Q1_a connected with the middle of the scan line 21, and the thin film transistors Q1_b corresponding to the two ends of the scan line 21 are the thin film transistors Q1_b respectively connected with the two ends of the scan line 21. Herein, only all the thin film transistors Q1 connected with one scan line 21 are taken as an example for the purpose of illustration, it is understood that all the thin film transistors Q1 connected with any same one scan line may have the above described characteristic.

The W/L ratio of the thin film transistor Q1 is a ratio of a channel width to a channel length of the thin film transistor Q1. The larger the W/L ratio is, the larger a current between the source and the drain of the thin film transistor Q1 is, and correspondingly the higher the charging ratio of the pixel electrode 23 is; i.e., in a same charging time, the larger the W/L ratio is, the higher a voltage obtained by the pixel electrode 23 is. Whereas, the smaller the W/L ratio is, the smaller the current between the source and the drain of the thin film transistor Q1 is, and correspondingly the lower the charging ratio of the pixel electrode 23 is. The charging ratio of the pixel electrode 23 is a ratio of the voltage of the pixel electrode 23 to a voltage of the data line 22; and in the ideal case, after the data line 22 charges the pixel electrode 23, the voltage of the pixel electrode 23 ought to reach the voltage of the data line 22.

It is indicated that, in FIG. 2, only one thin film transistor Q1 is labeled as the thin film transistor(s) Q1_a corresponding to the middle of the scan line 21, but it does not mean that the thin film transistor(s) Q1_a corresponding to the scan line 21 in this embodiment only is one thin film transistor Q1 connected with the midpoint of the scan line 21, the thin film transistor(s) Q1_a corresponding to the scan line 21 may multiple (i.e., more than one) thin film transistors Q1 connected with the middle portion of the scan line 21 with more serious distortion of scan signal. The thin film transistors Q1_b respectively corresponding to the two ends of the scan line 21 are in the same way.

In the prior art, W/L ratios of all the thin film transistors generally are the same, resulting from the RC delay of scan line, scan signals reaching the middle of the scan line are smaller than scan signals at two ends of the scan line, i.e., the scan signals at the middle of the scan line have more serious distortion, so that a voltage of the pixel electrode(s) corresponding to the middle of the scan line is much lower than a voltage of the pixel electrodes corresponding to the two ends of the scan line after the data lines charging the pixel electrodes, causing the phenomenon of "two sides being whity". The smaller the scan signal is, the lower the charging ratio of the pixel electrode is; but the larger the W/L ratio of the thin film transistor is, the higher the charging ratio of the pixel electrode is. In this embodiment, the W/L ratio of the thin film transistor(s) Q1_a corresponding to the middle of the scan line 21 is given a relatively large value while the W/L ratio of the thin film transistors Q1_b corresponding to the two ends of the scan line 21 is given a relatively small value, so as to deal with different degrees of distortion for the scan signals at different positions by making the thin film transistors Q1 at different positions to have different W/L ratios, and thereby the difference of charging ratios of the pixel electrodes 23 corresponding to different positions of the scan line 21 is reduced, even the charging ratios tend to the same.

Figure 3:
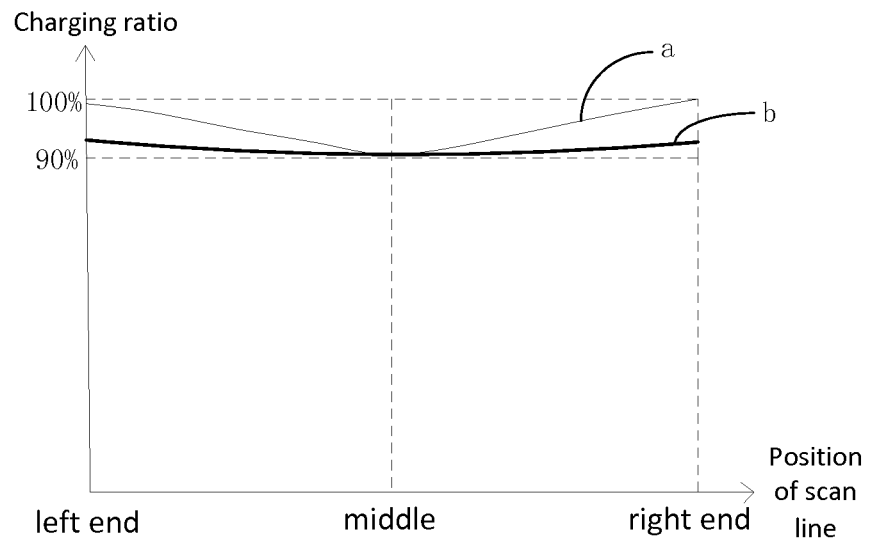
FIG. 3 is a schematic curve diagram of charging ratios of pixel electrodes in an embodiment of the array substrate according to the present invention, where a curve diagram of charging ratios of pixel electrodes in the prior art also is illustrated.
Figure 4:
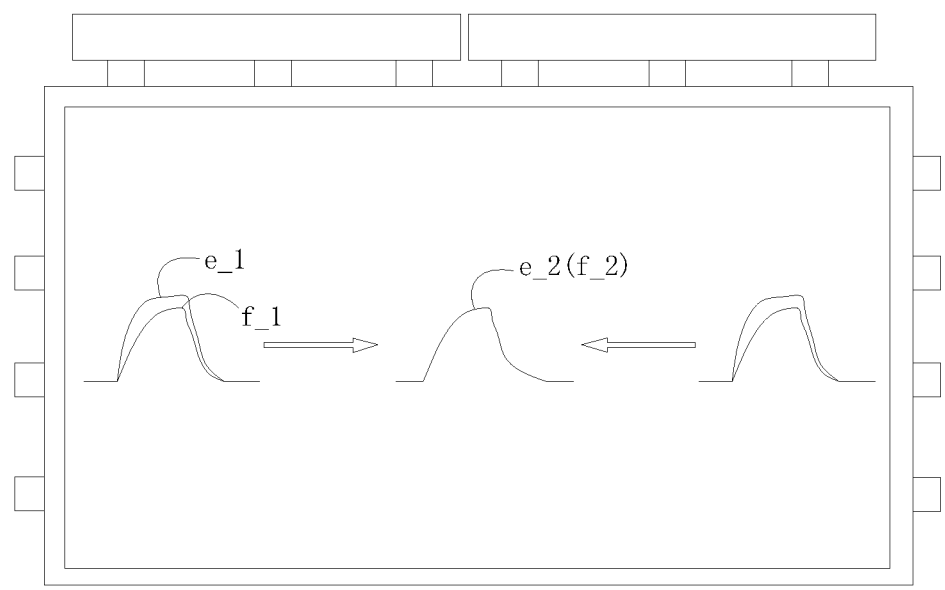
FIG. 4 is a voltage waveform diagram of pixel electrodes in an embodiment of the array substrate according to the present invention, where a voltage waveform diagram of pixel electrodes in the prior art also is illustrated.

For example, referring to FIGS. 3 and 4, FIG. 3 is a waveform diagram associated with charging ratios of pixel electrodes in this embodiment and charging ratios of pixel electrodes in the prior art, and FIG. 4 is a waveform diagram associated with voltages of pixel electrodes in this embodiment and voltages of pixel electrodes in the prior art. In FIG. 4, only the voltage waveforms of the pixel electrodes at the two sides and the middle are shown. Regarding the pixel electrodes of the prior art, suffering from the influence of RC delay of scan signal, the charging ratio of the pixel electrode corresponding to the middle of scan line generally only is about 90%, while the charging ratio of the pixel electrodes corresponding to the two ends of scan line especially the pixel electrodes closest to input ends of scan signal may be up to 100%, as denoted by the curve "a" in FIG. 3. In the prior art, the voltage waveform of the pixel electrodes at the two sides and the voltage waveform of the pixel electrode at the middle respectively are the waveforms e_1, e_2 as shown in FIG. 4, and as seen from the waveform diagram, the voltage of the pixel electrodes at the two sides is higher than the voltage of the pixel electrode at the middle. Contradistinctively, in the embodiment of the present invention, by making the W/L ratio of the thin film transistors Q1_b corresponding to the left and right ends of the scan line 21 to be smaller than the W/L ratio of the thin film transistor(s) Q1_a corresponding to the middle of the scan line 21, the charging ratio of the pixel electrodes 23 connected with the thin film transistors Q1_b corresponding to the left and right ends of the scan line 21 is reduced, as denoted by the curve "b" of FIG. 3, so that the charging ratio difference between the pixel electrodes 23 connected with the thin film transistors Q1_b corresponding to the left and right ends of the scan line 21 and the pixel electrode(s) 23 connected with the thin film transistor(s) Q1_a corresponding to the middle of the scan line 21 is reduced, and thereby a voltage difference between the pixel electrode(s) 23 connected with the thin film transistor(s) Q1_a corresponding to the middle of the scan line 21 and the pixel electrode 23 connected with the thin film transistor Q1_b corresponding to the two ends of the scan line 21 may be smaller than a threshold value, and thereby the voltage of the pixel electrode(s) 23 connected with the thin film transistor(s) Q1_a corresponding to the middle of the scan line 21 is approximately the same as the voltage of the pixel electrodes 23 connected with the thin film transistors Q1_b corresponding to the two ends of the scan line 21. Accordingly, when displaying an image, the image brightness corresponding to the middle of the scan line 21 is about the same as the image brightnesses corresponding to the two ends of the scan line 21, and the uniformity of image brightness is improved. In the embodiment of the present invention, the voltage waveform of the pixel electrodes 23 corresponding to the two ends of the scan line 21 and the voltage waveform of the pixel electrode 23 corresponding to the middle of the scan line 21 respectively are the waveforms f_1, f_2 as shown in FIG. 4, and as seen from the voltage waveforms, it can be found that the voltage of the pixel electrodes 23 at the two sides is lower than the voltage of the pixel electrodes at the two sides in the prior art, and is substantially same as the voltage of the pixel electrode 23 at the middle.

In practical applications, because of the influence of factors such as manufacturing process, it may be difficult to make the voltage of the pixel electrode(s) 23 of the thin film transistor(s) Q1_a corresponding to the middle of the scan line 21 is exactly equal to the voltage of the pixel electrodes 23 connected with the thin film transistors Q1_b corresponding to the two ends of the scan line 21. It can be understood to the ordinary skill in the art that, according to the solution proposed by the embodiment of the present invention, the W/L ratios of the thin film transistors Q1 corresponding to different positions of the scan line 21 can be set according to the distortion degrees of scan signal, i.e., the W/L ratio of the thin film transistors Q1_b corresponding to the two ends of the scan line 21 with slight distortion of scan signal can be set to be small, the W/L ratio of the thin film transistor(s) Q1_a corresponding to the middle of the scan line 21 with more serious distortion of scan signal can be set to be large, and thereby making the voltage difference between the pixel electrode(s) 23 at the middle and the pixel electrodes 23 at the two sides to be as small as possible, so that the image brightness at the middle and the image brightness at the two sides tend to the same, and the uniformity of the image brightness is improved.

Figure 5:
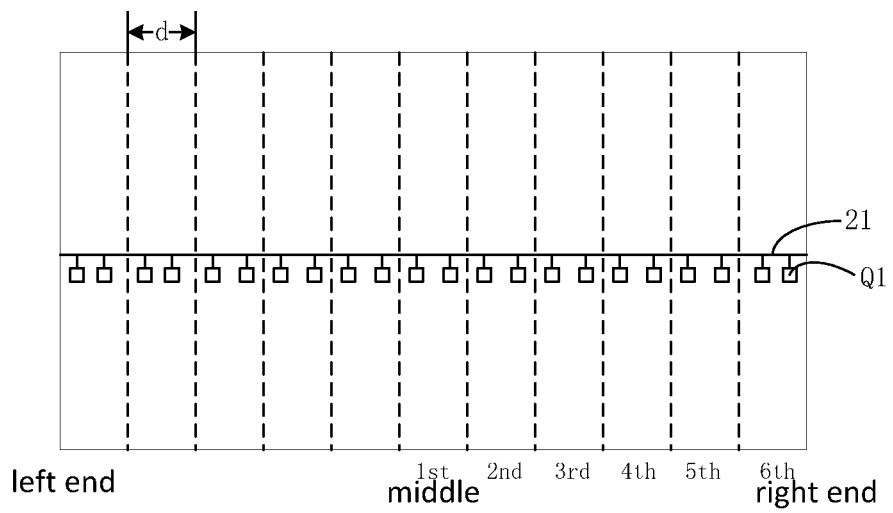
FIG. 5 is a schematic view of the array substrate being divided into multiple areas at intervals of a predetermined distance length along the lengthwise direction of a scan line in an embodiment of the array substrate according to the present invention.

The farther away from the signal input end, the more serious the distortion of scan signal is. In order to further improve the uniformity of image brightness, in an embodiment of the array substrate according to the present invention, as shown in FIG. 5, in the thin film transistors Q1 connected with one scan line 21, W/L ratios of the thin film transistors Q1 are progressively decreased from the middle of the scan line 21 to each of the two ends of the scan line 21 at intervals of a predetermined distance d, and the W/L ratios of the thin film transistors Q1 within a same predetermined distance d are the equal to each other. Generally, in a small section of the scan line 21, the difference of distortion degrees of scan signal at different positions of the scan line 21 is not significant, and thus the difference between the charging ratios of the multiple pixel electrodes 23 corresponding to the section of the scan line 21 also is not significant; the predetermined distance d in the embodiment is set to be the length of the section of the scan line 21 with non-significant difference of distortion degrees of scan signal, and the distance length can be set according to the distortion degrees of scan signal.

For example, according to the distortion degrees of scan signal, the array substrate is divided into eleven areas each with the distance length of d along the lengthwise direction of the scan line 21. The middle area 1st is the area corresponding to the middle of the scan line 21, thin film transistors Q1 located in the middle area 1st are the thin film transistors corresponding to the middle of the scan line 21. Two most sided areas 6th are the areas respectively corresponding to the two ends of the scan line 21, and thin film transistors Q1 located in the two most sided areas 6th are the thin film transistors corresponding to the two ends of the scan line 21. Substrate structures at left side and right side of the middle area 1st are symmetrical, and thus only the right side substrate structure will be described below for the purpose of illustration. Accordingly, as to all the thin film transistors Q1 connected with one scan line 21, the W/L ratios of the thin film transistors Q1 are progressively decreased from the middle area 1st to the right-most sided area 6th, and the W/L ratios of the thin film transistors Q1 within a same area are equal to each other. Accordingly, in this embodiment, the W/L ratio of the thin film transistors Q1 in the middle area 1st is the largest, while the W/L ratio of the thin film transistors Q1 in the right-most sided area 6th is the smallest.

FIG. 5 only schematically shows a section of the scan line 21 corresponding to two thin film transistors Q1_being used as one spaced distance d. In other embodiment, according to the distortion degrees of scan signal, a section of the scan line 21 corresponding to more (e.g., ten, twenty, etc.) thin film transistors Q1 is used as one spaced distance d.

In addition, in this embodiment, the W/L ratios of the thin film transistors are progressively decreased in an equi-difference manner, i.e., a difference of the W/L ratios of the thin film transistors of each two neighboring areas is a same value. Of course, in other embodiment, the difference may be set to be different, the W/L ratios of the thin film transistors Q1 in the respective areas can be set according to the distortions of scan signal to thereby make the voltages of the pixel electrodes 23 corresponding to different distortions on the scan line 21 to be substantially equal to each other, and the uniformity of the image brightness is improved consequently.

Figure 6:
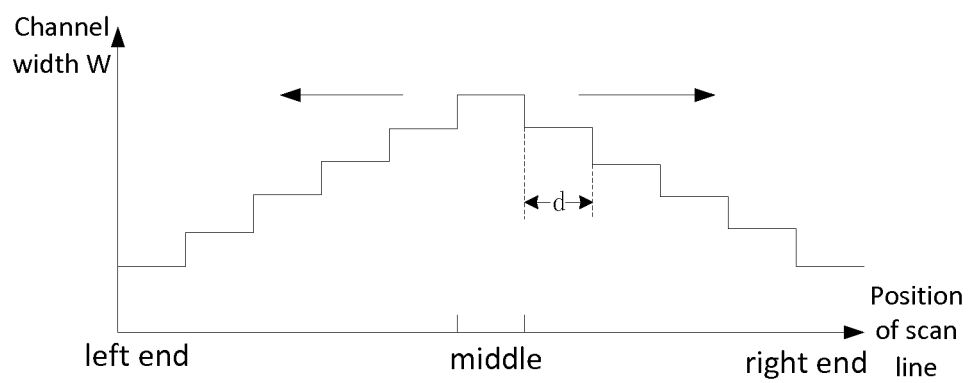
FIG. 6 is a schematic variation curve diagram of channel widths of thin film transistors in an embodiment of the array substrate according to the present invention.

The W/L ratio of the thin film transistor Q1 can be varied by changing a channel width W of the thin film transistor Q1. Specifically, as shown in FIG. 6, as to all the thin film transistors Q1 connected with one scan line 21, channel lengths of all the thin film transistors Q1 are the same, the channel widths W of the thin film transistors Q1 are progressively decreased from the middle of the scan line 21 to each of the two ends of the scan line 21 at intervals of the predetermined distance d, and the channel widths W of the thin film transistors Q1 within a same predetermined distance d are equal to each other. That is, the channel widths W of the thin film transistors Q1 are progressively decreased from the middle area 1st to each of the two most sided areas 6th, and the channel widths W of the thin film transistors Q1 in a same area are equal to each other.

For example, the channel width W of all the thin film transistors in the middle area 1st is 40 μm (micrometers), and starting from the middle area 1st, the channel width W of the thin film transistors Q1 of each area is progressively decreased with 0.5 μm, and therefore the channel width W of the thin film transistors Q1 in each of the two most sided areas 6th is 37.5 μm, as listed in the following table 1.

TABLE 1

Channel widths of thin film transistors in respective areas in the right side of the array substrate

| area | 1st | 2nd | 3rd | 4th | 5th | 6th |
|---|---|---|---|---|---|---|
| W(μm) | 40 | 39.5 | 39 | 38.5 | 38 | 37.5 |

Figure 7:
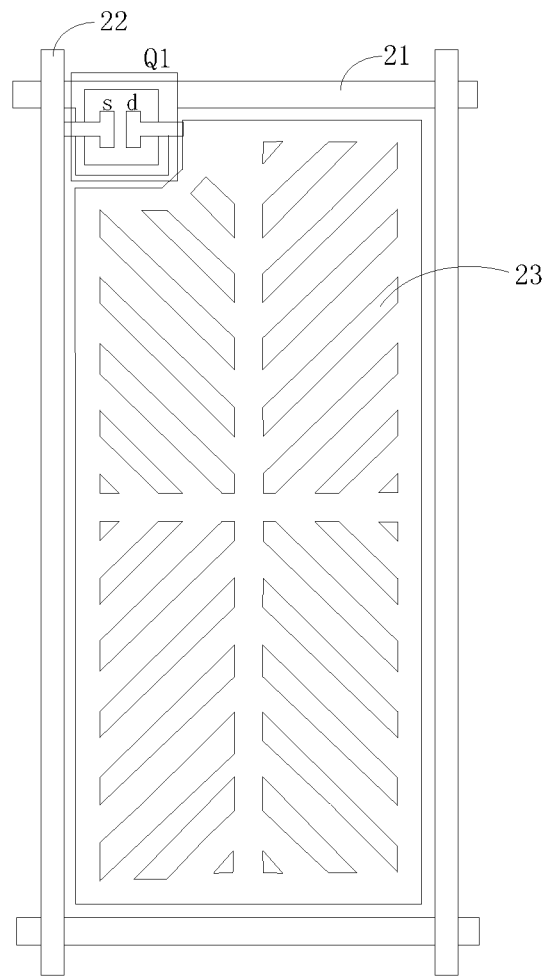
FIG. 7 is a schematic structural view of a pixel structure corresponding to the middle of a scan line in an embodiment of the array substrate according to the present invention.
Figure 8:
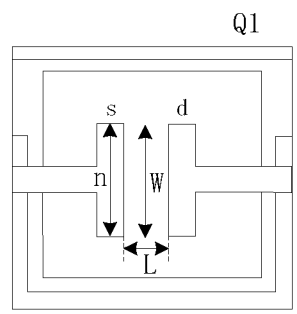
FIG. 8 is a schematic view of an enlarged structure of a thin film transistor in the pixel structure as shown in FIG. 7.
Figure 9:
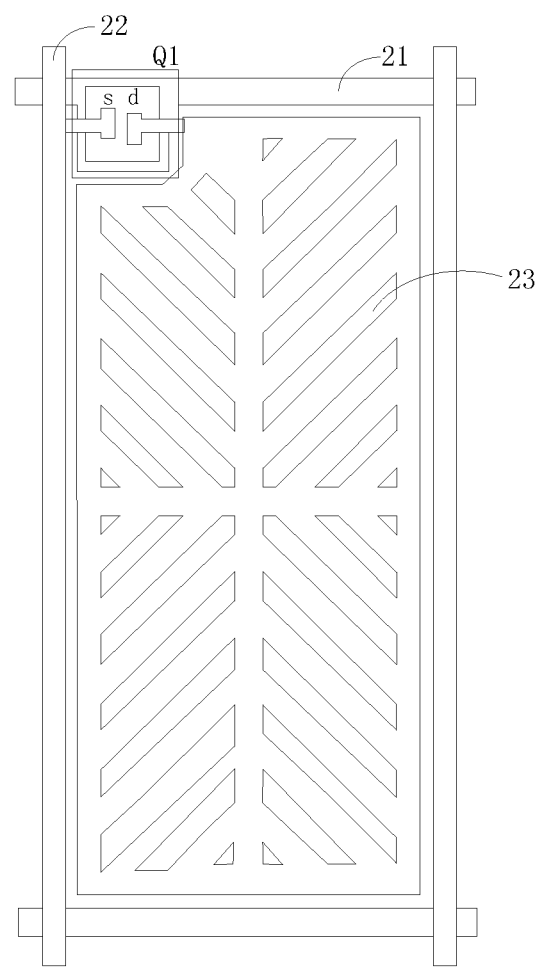
FIG. 9 is a schematic structural view of a pixel structure corresponding to other one position of the scan line in an embodiment of the array substrate according to the present invention.
Figure 10:
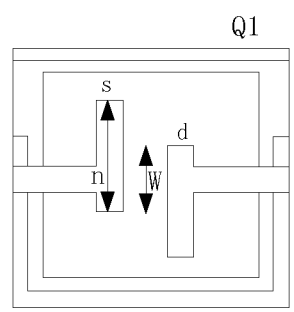
FIG. 10 is a schematic view of an enlarged structure of a thin film transistor in the pixel structure as shown in FIG. 9.

In the embodiment of the present invention, by making the sizes of overlapping portions of source layers with drain layers of thin film transistors Q1 in the different areas to be different, different chancel widths W of the thin film transistors in the different areas can be achieved. Specifically, the sizes of the overlapping portions of the source layers with the drain layers of the thin film transistors Q1 are progressively decreased from the middle of the scan line 21 to each of the two ends of the scan line 21t at intervals of the predetermined distance d, and the sizes of the overlapping portions of the source layers with the drain layers of the thin film transistors in a same predetermined distance d are equal to each other. Referring to FIG. 7 and FIG. 8, FIG. 7 is a schematic view of a concrete structure of an embodiment of one pixel structure in the array substrate according to the present invention, and FIG. 8 is a schematic view of an enlarged structure of the thin film transistor Q1 as shown in FIG. 7, the same reference numerals in the figures refer to the same elements. As shown in FIGS. 7 and 8, the source layer s and the drain layer d of the thin film transistor Q1 are parallel structures, the channel width W of the thin film transistor Q1 is the size of the overlapping portion of the source layer s with the drain layer d. In this embodiment, same as the illustration of FIGS. 7 and 8, the source layer s and the drain layer d of each thin film transistor Q1 in the middle area 1st are completely overlapped with each other, the channel width W of each thin film transistor Q1 in the middle area 1st is maximum and equal to an actual length n of the source layer s and the drain layer d. In other areas, the source layer s and the drain layer d of each thin film transistor Q1 are partially overlapped, as shown in FIGS. 9 and 10, so that the channel width W is smaller than the actual length n of the source layer s and the drain layer d, and the sizes of the overlapping portions of source layers s with drain layers d are progressively decreased from the middle area 1st to the right-most sided area 6th. As a result, the channel widths W of the thin film transistors Q1_being progressively decreased from the middle area 1st to each of the two most sided areas 6th is achieved.

In this embodiment, the source layer s and the drain layer d are arranged parallel to each other, the actual lengths n of the source layers s of the thin film transistors Q1 in different areas are the same, the actual lengths of the drain layers d in different areas also are the same, and the actual length of the source layers s and that of the drain layers are the same. Accordingly, during manufacturing the array substrate, for the thin film transistors of different areas, by panning/translating the source layer s or drain layer d to change the relative position of the source layer s and the drain layer d, the size of overlapping portion of the source layer s with the drain layer d is varied, i.e., the channel width W is varied, and thereby the channel width W can be precisely controlled while a load of data line 22 and a parasitic capacitance of pixel electrode 23 in each area can be kept unchanged.

Figure 11:
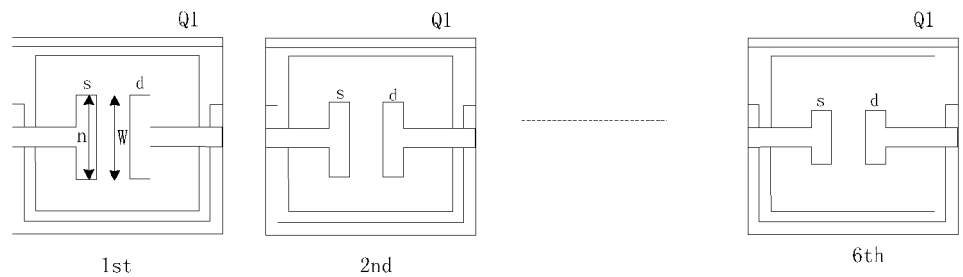
FIG. 11 is a schematic structural view of thin film transistors corresponding to different positions of a scan line in another embodiment of the array substrate according to the present invention.
Figure 12:
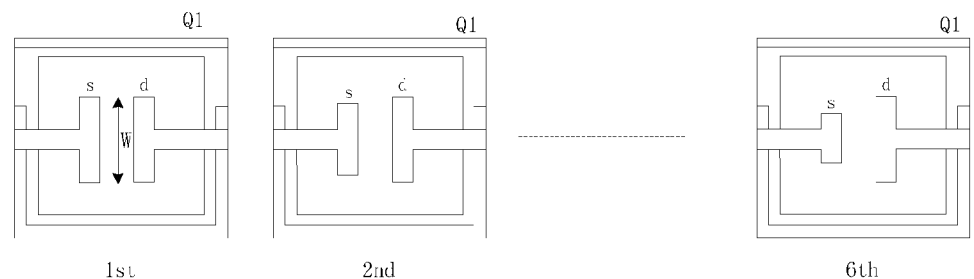
FIG. 12 is a schematic structural view of thin film transistors corresponding to different positions of a scan line in still another embodiment of the array substrate according to the present invention.
Figure 13:
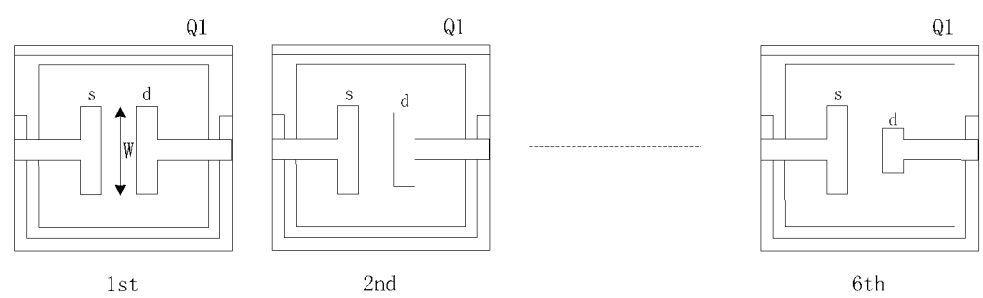
FIG. 13 is a schematic structural view of thin film transistors corresponding to different positions of a scan line in even still another embodiment of the array substrate according to the present invention.

Of course, in other embodiment, the channel width W can be varied by changing the actual length(s) of the source layer s and/or the drain layer d. As shown in FIG. 11, in this situation, the actual length of the source layer s and the actual length of the drain layer d of a same one thin film transistor Q1 are equal to each other. The source layer s and the drain layer d in a same one area are completely overlapped, but the actual lengths of the source layers s/drain layers d in different areas are different from each other, the actual lengths of the source layers s/drain layers d of the thin film transistors Q1 are progressively decreased from the middle area 1st to the right-most sided area 6th, the actual length of the source layer s/drain layer d of the thin film transistor Q1 in the middle area 1st is the longest, the actual length of the source layer s/drain layer d of the thin film transistor Q1 in the right-most sided area 6th is the shortest, and thereby the channel widths W of the thin film transistors Q1 are progressively decreased from the middle area 1st to the right-most sided area 6th. Of course, in other embodiments, as shown in FIG. 12, the actual lengths of the drain layers d of the thin film transistors Q1 in different areas are kept unchanged, and the actual lengths of the source layers s are progressively decreased from the middle area 1st to the right-most sided area 6th. Or, as shown in FIG. 13, the actual lengths of the source layers s of the thin film transistors Q1 in different areas are kept unchanged, and the actual lengths of the drain layers d are progressively decreased from the middle area 1st to the right-most sided area 6th.

In the above various embodiments, the W/L ratio of the thin film transistor Q1 is varied by changing the channel width W. In other embodiment of the present invention, the W/L ratio of the thin film transistor can be varied by changing the channel length L, and the channel length L is a distance between the source layer and the drain layer of the thin film transistor. In this situation, in all the thin film transistors connected with one scan line, the channel widths of all the thin film transistors are the same, the channel lengths of the thin film transistors are progressively increased from the middle of the scan line to each of two ends of the scan line at intervals of a predetermined distance, and the channel lengths of the thin film transistors within a same predetermined distance are the same, and thereby the W/L ratios of the thin film transistors are progressively decreased from the middle of the scan line to each of two ends of the scan line at intervals of the predetermined distance.

Figure 14:
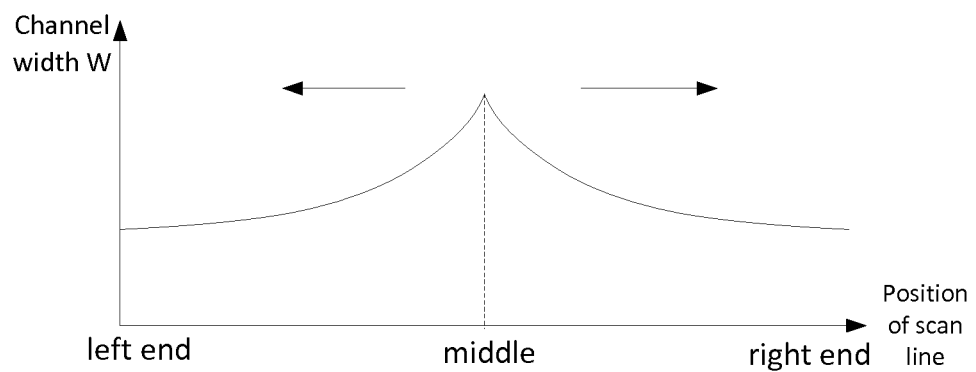
FIG. 14 is a schematic variation curve diagram of channel widths of thin film transistors in an embodiment of the array substrate according to the present invention.

In addition, in the above various embodiments, the W/L ratios of the thin film transistors are progressively decreased in a stepwise manner from the middle of the scan line to each of the two ends of the scan line, and the W/L ratios of the thin film transistors in a same area are the same. In other embodiment of the present invention, as shown in FIG. 14, in the thin film transistors connected with one scan line, the W/L ratios of the thin film transistors also may be successively decreased from the middle of the scan line to each of the two ends of the scan line, may be successively decreased in an equi-tolerance manner, also may be successively decreased in other manner, i.e., in this embodiment, the W/L ratios of two neighboring thin film transistors are different from each other, and a difference between the W/L ratios of each two neighboring thin film transistors may be a same value or a different value and can be set according to the distortions of scan signal, as long as the difference of charging ratios among the pixel electrodes corresponding to different positions of the scan line is reduced. In this embodiment, the thin film transistor(s) corresponding to the middle of the scan line is one thin film transistor connected to the midpoint of the scan line, and thin film transistors corresponding to the two ends of the scan line are two most sided thin film transistors respectively connected with the two ends of the scan line.

Figure 15:
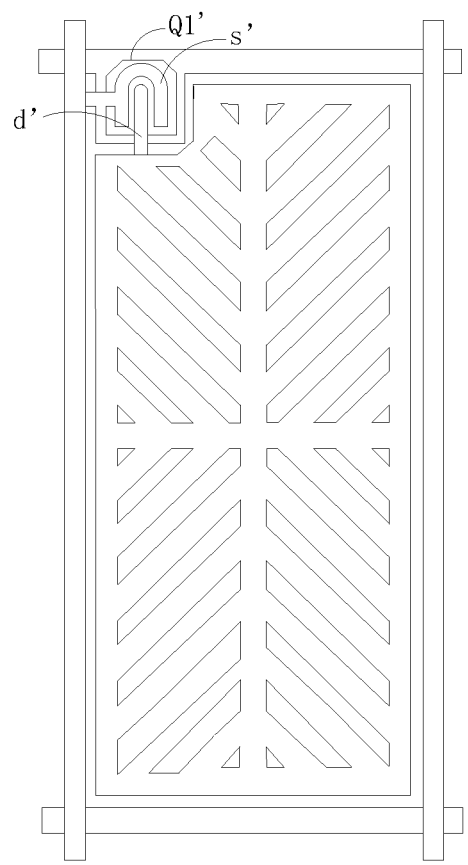
FIG. 15 is a schematic view of a pixel structure having a horseshoe shaped thin film transistor in an embodiment of the array substrate according to the present invention.

In another embodiment of the array substrate according to the present invention, a difference from the above various embodiments is that: as shown in FIG. 15, the thin film transistor Q1' has a horseshoe shaped structure, and the source layer s' and the drain layer d' are not parallel structures. By using the horseshoe shaped thin film transistor, it is also feasible to make the W/L ratio of the thin film transistor(s) corresponding to the middle of the scan line to be larger than the W/L ratio of the thin film transistors corresponding to the two ends of the scan line, so as to reduce the voltage difference between the pixel electrode(s) corresponding to the middle of the scan line and the pixel electrodes corresponding to the two ends of the scan line, so that the uniformity of image brightness can be improved. A specific implementation solution can refer to the above embodiments, and thus will not be repeated.

Figure 16:
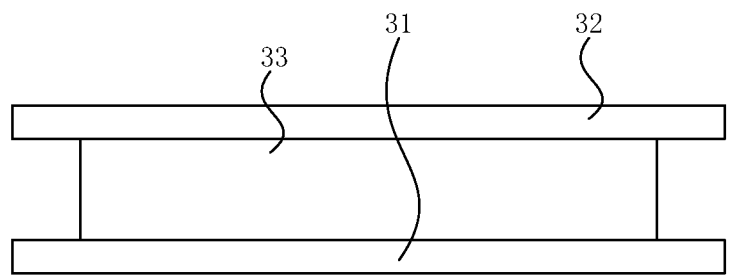
FIG. 16 is a schematic structural view of an embodiment of a liquid crystal display panel according to the present invention.

Referring to FIG. 16, in an embodiment of a liquid crystal display panel according to the present invention, the liquid crystal display panel includes an array substrate 31, a color filter substrate 32 and a liquid crystal layer 33 arranged between the array substrate 31 and the color filter substrate 32. The array substrate 31 is the array substrate of any one of the above embodiments.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An array substrate comprising scan lines, data lines, thin film transistors and pixel electrodes; wherein:
    gates of the thin film transistors are connected with the scan lines, sources of the thin film transistors are connected with the data lines, drains of the thin film transistors are connected with the pixel electrodes, and a source layer and a drain layer of each of the thin film transistors are mutually parallel;
    in the thin film transistors connected with one of the scan lines, width-to-length ratios of the thin film transistors are progressively decreased from the middle of the scan line to each of two ends of the scan line at intervals of a predetermined distance, the width-to-length ratios of the thin film transistors within a same predetermined distance are equal to each other, and thereby the width-to-length ratio of the thin film transistor(s) corresponding to the middle of the scan line is larger than the width-to-length ratio of the thin film transistors corresponding to the two ends of the scan line, so that when the data lines input voltage signals, a voltage difference between the pixel electrode(s) connected with the thin film transistor(s) corresponding to the middle of the scan line and the pixel electrodes connected with the thin film transistors corresponding to the two ends of the scan line is smaller than a threshold value.

2. The array substrate according to claim 1, wherein channel lengths of the thin film transistors are the same, channel widths of the thin film transistors are progressively decreased from the middle of the scan line to each of the two ends of the scan line at intervals of the predetermined distance, and the channel widths of the thin film transistors within a same predetermined distance are the same.

3. The array substrate according to claim 2, wherein sizes of overlapping portions of the source layers with the drain layers of the thin film transistors are progressively decreased from the middle of the scan line to each of the two ends of the scan line at intervals of the predetermined distance, and the sizes of the overlapping portions of the source layers with the drain layers of the thin film transistors within a same predetermined distance are the same.

4. An array substrate comprising scan lines, data lines, thin film transistors and pixel electrodes; wherein:
    gates of the thin film transistors are connected with the scan lines, sources of the thin film transistors are connected with the data lines, and drains of the thin film transistors are connected with the pixel electrodes;
    in the thin film transistors connected with one of the scan lines, a width-to-length ratio of the thin film transistor(s) corresponding to the middle of the scan line is larger than the width-to-length ratio of the thin film transistors corresponding to two ends of the scan line, and thereby when the data lines input voltage signals, a voltage difference between the pixel electrode(s) connected with the thin film transistor(s) corresponding to the middle of the scan line and the pixel electrodes connected with the thin film transistors corresponding to the two ends of the scan line is smaller than a threshold value.

5. The array substrate according to claim 4, wherein in the thin film transistors connected with one of the scan lines, the width-to-length ratios of the thin film transistors are progressively decreased from the middle of the scan line to each of the two ends of the scan line at intervals of a predetermined distance, and the width-to-length ratios of the thin film transistors within a same predetermined distance are equal to each other.

6. The array substrate according to claim 5, wherein channel lengths of the thin film transistors are the same, channel widths of the thin film transistors are progressively decreased from the middle of the scan line to each of the two ends of the scan line at intervals of the predetermined distance, and the channel widths of the thin film transistors within a same predetermined distance are equal to each other.

7. The array substrate according to claim 6, wherein sizes of overlapping portions of source layers with drain layers of the thin film transistors are progressively decreased from the middle of the scan line to each of the two ends of the scan line at intervals of the predetermined distance, and the sizes of the overlapping portions of the source layers with the drain layers of the thin film transistors within a same predetermined distance are the same.

8. The array substrate according to claim 4, wherein in the thin film transistors connected with one of the scan lines, the width-to-length ratios of the thin film transistors are successively decreased from the middle of the scan line to each of the two ends of the scan line.

9. The array substrate according to claim 4, wherein a source layer and a drain layer of each of the thin film transistors are parallel to each other.

10. A liquid crystal display panel comprising an array substrate, a color filter substrate and a liquid crystal layer arranged between the array substrate and the color filter substrate; wherein:
    the array substrate comprises scan lines, data lines, thin film transistors and pixel electrodes;
    gates of the thin film transistors are connected with the scan lines, sources of the thin film transistors are connected with the data lines, and drains of the thin film transistors are connected with the pixel electrodes;
    in the thin film transistors connected with one of the scan lines, a width-to-length ratio of the thin film transistor(s) corresponding to the middle of the scan line is larger than the width-to-length ratio of the thin film transistors corresponding to two ends of the scan line, and thereby when the data lines input voltage signals, a voltage difference between the pixel electrode(s) connected with the thin film transistor(s) corresponding to the middle of the scan line and the pixel electrodes connected with the thin film transistors corresponding to the two ends of the scan line is smaller than a threshold value.

11. The liquid crystal display panel according to claim 10, wherein the width-to-length ratios of the thin film transistors are progressively decreased from the middle of the scan line to each of the two ends of the scan line at intervals of a predetermined distance, and the width-to-length ratios of the thin film transistors within a same predetermined distance are equal to each other.

12. The liquid crystal display panel according to claim 11, wherein channel lengths of the thin film transistors are the same, channel widths of the thin film transistors are progressively decreased from the middle of the scan line to each of the two ends of the scan line at intervals of the predetermined distance, and the channel widths of the thin film transistors within a same predetermined distance are equal to each other.

13. The liquid crystal display panel according to claim 12, wherein sizes of overlapping portions of source layers with drain layers of the thin film transistors are progressively decreased from the middle of the scan line to each of the two ends of the scan line at intervals of the predetermined distance, and the sizes of the overlapping portions of the source layers with the drain layers of the thin film transistors within a same predetermined distance are the same.

14. The liquid crystal display panel according to claim 10, wherein in the thin film transistors connected with one of the scan lines, the width-to-length ratios of the thin film transistors are successively decreased from the middle of the scan line to each of the two ends of the scan line.

15. The liquid crystal display panel according to claim 10, wherein a source layer and a drain layer of each of the thin film transistors are parallel to each other.

* * * * *